United States Patent [19]
Parker et al.

[11] Patent Number: 5,748,653
[45] Date of Patent: May 5, 1998

[54] VERTICAL CAVITY SURFACE EMITTING LASERS WITH OPTICAL GAIN CONTROL (V-LOGIC)

[75] Inventors: Michael A. Parker, Liverpool; Richard J. Michalak, Manlius; James S. Kimmet, Rome; Douglas B. Shire, Ithaca, all of N.Y.; Paul D. Swanson, Santee, Calif.; Chung L. Tang, Ithaca, N.Y.

[73] Assignee: The United States of America as represented by the Secretary of the Air Force, Washington, D.C.

[21] Appl. No.: 616,979

[22] Filed: Mar. 18, 1996

[51] Int. Cl.[6] ............................................. H01S 3/10
[52] U.S. Cl. ............................ 372/8; 372/45; 372/50
[58] Field of Search ........................ 372/8, 50, 96, 372/45, 46

[56] References Cited

U.S. PATENT DOCUMENTS

| | | | |
|---|---|---|---|
| 3,242,440 | 3/1966 | Koester et al. | 331/94.5 |
| 3,430,160 | 2/1969 | Kosonocky | 331/94.5 |
| 3,431,437 | 3/1969 | Kosonocky | 307/312 |
| 3,439,289 | 4/1969 | Kosonocky | 331/94.5 |
| 3,509,384 | 4/1970 | Fowler et al. | 307/312 |
| 3,525,024 | 8/1970 | Kawaji | 317/234 |
| 3,555,455 | 1/1971 | Paine | 331/94.5 |
| 4,546,244 | 10/1985 | Miller | 250/211 J |
| 4,825,442 | 4/1989 | Fitz | 372/8 |
| 5,166,946 | 11/1992 | Caldwell | 372/50 |
| 5,349,593 | 9/1994 | Lomasheuitch et al. | 372/50 |
| 5,384,798 | 1/1995 | Zucker et al. | 372/26 |

*Primary Examiner*—James W. Davie
*Attorney, Agent, or Firm*—Harold L. Burstyn; William G. Auton

[57] ABSTRACT

The Vertical-cavity-surface-emitting Lasers with Optical Gain Control (V-LOGIC) form a family of integrated optical smart pixels for interconnect and signal processing applications. V-LOGIC devices consist of Vertical Cavity Surface Emitting Lasers (VCSELs) and In-Plane Lasers. (IPL) with cross-coupled cavities. The devices can operate in a digital, an analog or a hybrid mode. The IPLs either fully quench or modulate the VCSEL depending on whether the device is used in the digital or analog mode. In the Hybrid mode, one IPL serves as an enable input while another one modulates the VCSEL. The V-LOGIC devices can operate significantly faster than modulated lasers since, for the quenching phenomena, (1) the VCSEL carrier population is essentially constant and (2) the quenching is all-optical and does not require intermediate drive electronics. The family of devices solve the leading outstanding problems in optical switching and interconnect technologies. In particular, they form the basis for multiplanar optical signal processors, N×M optical routers, ATM and packet switching fabrics, and multi-chip modules.

20 Claims, 2 Drawing Sheets

VERTICAL CAVITY SURFACE EMITTING LASERS WITH OPTICAL GAIN CONTROL (V-LOGIC)

STATEMENT OF GOVERNMENT INTEREST

The invention described herein may be manufactured and used by or for the Government for governmental purposes without the payment of any royalty thereon.

CROSS REFERENCE TO RELATED APPLICATION

This application is related to the technology of application Ser. No. 08/366,218 filed on 30 Dec. 1994, now U.S. Pat. No. 5,604,628, the disclosure of which is incorporated herein by reference.

BACKGROUND OF THE INVENTION

The present invention relates generally to optical laser amplifiers, and more specifically, the invention relates to a vertical cavity surface emitting laser structure with optical gain control. Signal processors are presently limited by the performance of the electronic logic gates and the electrical interconnections between those gates. Compared with projections for the performance of optical devices, present logic elements are slow in addition to their large power requirements. There are two significant problems with present architectures especially in the area of interconnects. The first concerns the two dimensional aspect of integrated circuitry where the data signals are confined to a plane. Here, the complexity and density of the interconnections increase faster than that for the devices. Some integrated circuit manufacturers now use multiple levels of metal interconnections between planar logic devices but this approach still has its limitations. The second problem concerns the electrical nature of the interconnects. The bandwidth is limited by RC charging time constants and impedance matching effects. In addition, the cross-talk between channels and the power required to drive the interconnect increases with the driving frequency. These problems can be solved by the use of interconnects that are optical, rather than electrical, in nature. The preferred architecture for signal processors and communication systems makes use of a set of stacked wafers that communicate with each other by light. The use of surface-emitting optical interconnects increases the parallelism of the data link and, hence, also the speed of the system through efficient use of three dimensions. The devices that produce or modulate the light can also be given logic functions. Thus, in effect, one device can serve as a logic element and as an interconnect. Such smart pixels are generally viewed as single devices or small clusters of devices.

Smart pixels can be divided into two different types. The first type is the all-optical smart pixel. For this case, one or several beams of light interact with a small volume of matter to produce a resultant beam. The light must interact with the electric charge in the material to produce the desired effect. The other type is the opto-electronic hybrid that has both optical and electronic components. In this case, photodetectors intercept the input light signals, electronic components implement a logic function and an optical transmitter generates the resultant beam. Generally, the conversions from optical to electrical signals and vice versa significantly decrease the speed of the device. The V-LOGIC devices form a family of all-optical smart pixels that are three dimensional in nature. These smart pixels advance the state of the art and solve many of the outstanding problems. At present, there is significant need for fast smart pixels for multiplanar optical signal processors, Asynchronous Transmission Mode (ATM) and packet switching fabrics, and n×m signal routers. These advanced systems are not feasible with the few presently available smart pixels such as the Self Electro-optic Effect Devices (SEEDs) from ATT Bell Labs, the surface Ce Emitting Laser Logic (CELL) devices from Photonics Research Incorporated and the Double-Heterostructure Opto-Electronic Switches (DOES) from Intelligent Automation. Although all of them are good devices, each type has limitations. For example, the SEED devices are inherently sensitive to heating and to relatively small variations in the wavelength of the optical signals. They require two optical signals for each channel for their dual rail architecture. Gain is only available as time-sequential gain where a weak optical signal first sets the switch and a stronger optical signal subsequently reads the state of the switch. In addition, the devices generally require complex optical systems for focusing and alignment. As a second example, the CELLS and DOESs are hybrid devices that operate at slower speeds than the all-optical devices. The CELLs consist of Heterostructure Bipolar Transistors (HBTs) epitaxially grown on VCSELs. As a result of this growth method, only certain logic functions can be implemented. The DOES devices are thyristor-like devices that require additional integrated electronic components. Consequently, they are not simple devices. The V-LOGIC devices are unique and do not have the problems associated with other smart pixels.

The task of creating smart pixel logic gates using vertical cavity surface emitting laser technology is alleviated by the use of the systems in the following U.S. Patents, the disclosures of which are incorporated herein by reference.

U.S. Pat. No. 3,242,440 issued to Koester et al;
U.S. Pat. No. 3,430,160 issued to Kosonocky;
U.S. Pat. No. 3,431,437 issued to Kosonocky;
U.S. Pat. No. 3,439,289 issued to Kosonocky;
U.S. Pat. No. 3,509,384 issued to Fowler et al;
U.S. Pat. No. 3,525,024 issued to Kawaji
U.S. Pat. No. 3,546,244 issued to Miller,
U.S. Pat. No. 3,555,455 issued to Pain;
U.S. Pat. No. 4,825,442 issued to Fitz;
U.S. Pat. No. 5,166,946 issued to Caldwell; and
U.S. Pat. No. 5,384,798 issues to Zucker l.

U.S. Pat. Nos. 3,242,440, 3,432,437 and 3,555,455 are of interest regarding the broad concept of modulating a laser with a laser. For example, U.S. Pat. No. 3,431,437 discloses an inverter device in which amplified light is used to quench a laser, cutting off output. U.S. Pat. No. 3,555,455 discloses a first, signal carrying laser and a second, modulating, laser, both aimed at a semiconductor material. The material is transparent to the first laser having a particular frequency, and affected by the second laser having a frequency different from the first. The second laser alters the semiconductor, thus affecting, i.e. modulating the first laser. See column 5, lines 40+.

U.S. Pat. Nos. 3,509,384 and 3,525,024 disclose logic elements using laser quenching. For example, U.S. Pat. No. 3,525,024 discloses an adder circuit using transverse, semiconductor lasers and quenching to carry out a mathematical function. In addition, the reference discloses an internal optical interconnection between elements within the device (see column 3, lines 61+.)

U.S. Pat. No. 4,825,442, cited in the subject disclosure, discloses a single mode semiconductor laser based, digital logic device. Light is coupled into a laser cavity, quenching laser output.

U.S. Pat. No. 4,546,244, issued to AT&T, discloses the SEED mechanism mentioned in the subject disclosure. It appears that a first input beam alters an electric field developed within a multiquantum well structure, altering its transmissivity to a second light beam.

As the above-cited patents illustrate, optical logic gates represent an area of technology under continual development. The present invention is a contribution to an ongoing area of development.

SUMMARY OF THE INVENTION

The present invention includes a new vertical cavity surface emitting laser logic gate design that uses: a laser substrate, an In-plane laser (IPL) with an IPL electrode, a vertical cavity surface emitting laser (VCSEL), and a VCSEL ring electrode. Both the IPL and VCSEL are mounted on the laser substrate, and the VCSEL is pumped, activated and modulated by the IPL. The VCSEL ring electrode surrounds the VCSEL and allows light from the VCSEL to be emitted perpendicular to the substrate rather than a planar emission. The logic gate functions occur when two or more IPLs have long laser cavities that intersect at the location of a central VCSEL. If the VCSEL has a lasing power threshold that requires the VCSEL to be pumped by both IPLs in order to stimulate emission, the arrangement forms an NAND gate. If either IPL can stimulate emission of the VCSEL, the same arrangement forms a NOR gate. The inverter V-logic VCSEL has the same configuration as the NOR gate.

Optical rotating can be performed by a central IPL with a long cavity that intersects the cavities of N adjacent IPLs with N VCSELs at the point of intersection (where N is an integer). When the VCSELs are AND gates, they are selectively activated by the adjacent IPLs to carry the signal of the central IPL.

It is an object of the invention to provide a vertical cavity surface emitting laser design that permits logical gate functions of optical interaction.

It is another object of the invention to propose a design that permits optical switching arrays of VCSEL laser elements.

These objects together with other objects, features and advantages of the invention will become more readily apparent from the following detailed description when taken in conjunction with the accompanying drawings wherein like elements are given like reference numerals throughout.

DETAILED DESCRIPTION OF THE PREFERRED EMBODIMENT

The present invention includes a design for Vertical-cavity-surface-emitting Lasers with optical gain control (V-LOGIC). The V-LOGIC device consists of a Vertical Cavity Surface Emitting Laser (VCSEL) and an In-Plane Laser (IPL) with cross-coupled cavities. A block diagram of a prototype inverted appears in FIG. 1. Both lasers are formed directly from the VCSEL heterostructure shown schematically in the inset to the figure. The VCSEL forms part of the IPL cavity since it is placed between the two etched (4.5 um deep) mirrors for the IPL. TiPtAu electrodes are evaporated directly on top of the DBR mirror p-layers. The VCSEL has a ring-shaped electrode so that light can be emitted perpendicular to the wafer in the z direction. Ridges are formed for waveguiding in the IPLs by a shallow etch (1.5 um) into the top Distributed Bragg Reflector (DBR) mirror layers. In addition, the shallow etch forms a gap (1 um wide) to separate the IPL gain section (20×200 um) from the VCSEL structure (20×20 um). Ionized hydrogen is implanted in all of the shallow and deep etched regions for electrical isolation between the lasers and for waveguiding in the VCSEL. A NiGeAu metal layer across the backside of the prototype serves as the n-contact for all of the devices.

Although, as discussed below, the prototype V-LOGIC device is tested with pulsed bias current to both lasers, the preferred mode of operation is with steady-state bias current. In operation, the VCSEL is biased above lasing threshold to maintain an inverted carrier population. The wave vector $k_z$, of the emitted light is perpendicular to the plane. When the IPL lases, it produces stimulated emission with a wave vector $k_x$ that travels within the hereostructure to the VCSEL. Photons in the $k_x$ mode compete with those in the $k_z$ mode for the inverted VCSEL population which is essentially fixed by the VCSEL bias current. The probability of stimulating a photon into one of the two modes is linearly related to the photon density of that mode. Increasing the bias current to the IPL increases the $k_x$ mode photon density due to transitions in both gain sections. As a result, the $k_z$ mode photon density and the optical power emitted perpendicular to the plane decrease. In addition, the competition between the two modes for the VCSEL gain medium causes an increase in the VCSEL threshold current when the $K_x$ mode photon density increases.

Figure 2:
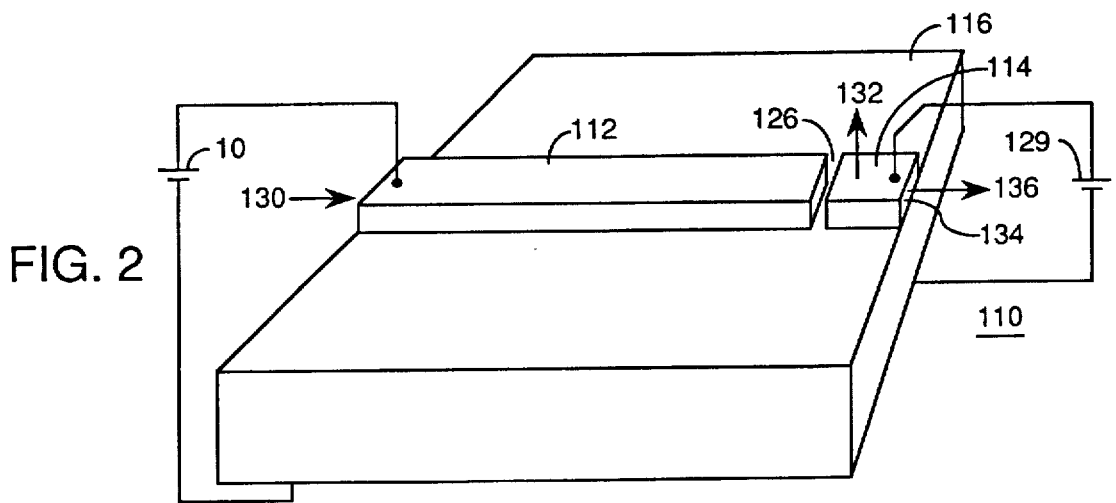
FIG. 2 is the VCSEL of the above-cited co-pending patent application.

In order to understand the technology of vertical cavity surface emitting lasers, the reader's attention is directed towards FIG. 2, which is a diagram of the VCSEL of the above-cited patent application. In particular, the device 110 includes an optical waveguide amplifier/laser 112 and a VCSEL 114, both of which are formed on a semiconductor substrate 116.

The amplifier/laser 112 and the VCSEL 114 are both constructed from a heterostructure 118. The heterostructure 118 is formed from any suitable semiconductor material and includes a multiple quantum well structure 120 which is sandwiched between first and second Distributed Bragg Reflector (DBR) mirror stacks 122. Each of the DBR mirror stacks 122 is of conventional construction, and is typically formed of alternating layers of GaAs and AlGaAs, each layer being a quarter wavelength thick. A first, p-type contact 124 is formed on the top exposed surface of the heterostructure 118, while a second n-type contact (not shown) is formed on the bottom exposed surface of the heterostructure 118. The contacts are employed to apply a bias current to the multiple quantum well structure 120 through the first and second DBR mirror stacks 122. Alternatively, the bias current can be applied directly to the multiple quantum well structure 120.

A vertical cut 126 is formed in the heterostructure 118 during fabrication to separate the amplifier/laser 112 and VCSEL 114 electrically from one another. Separate bias currents are applied to the amplifier/laser 112 and the VCSEL 114 by first and second voltage sources 128 and 129, respectively. This is necessary to provide the necessary adjustability of the amplifier's gain and VCSEL's drive current for proper operation of the amplifier and filter device 110.

Since the waveguide amplifier/laser 112 is substantially longer than it is wide, it acts to amplify an input optical laser signal entering an aperture at mirror 130 in the horizontal direction because of the resulting higher gain in that direction. On the other hand, the VCSEL 114, which is shown as being essentially square, has a higher gain in a vertical direction by virtue of the DBR mirror stacks 122, and thereby generates an output signal 132 in the vertical direction. This output signal 132 is an inverted, filtered version of the output signal from the amplifier/laser 112 that is used to quench the VCSEL 114. The VCSEL 114 also includes a cleaved sidewall facet 134 having either (1) an antireflection coating formed thereon which prevents the amplifier's output signal from reflecting back through the VCSEL 114, and disrupting operation of the device, or (2) etched/cleaved mirrors for laser operation. For the case of an antireflection coating, the amplifier's output signal therefore passes unaltered through the cleaved facet 134, and thereby provides a second, unfiltered amplified output signal 136 for the device 110. The second mirror for laser operation of the waveguide is at 130.

The advantages of the VCSEL are that it has a narrow line width and a symmetrical output beam emitting perpendicular to the surface of the substrate 116. Optical fibers can also be easily attached to the output of the VCSEL 114 with coupling coefficients that are better for IPLs.

Figure 3:
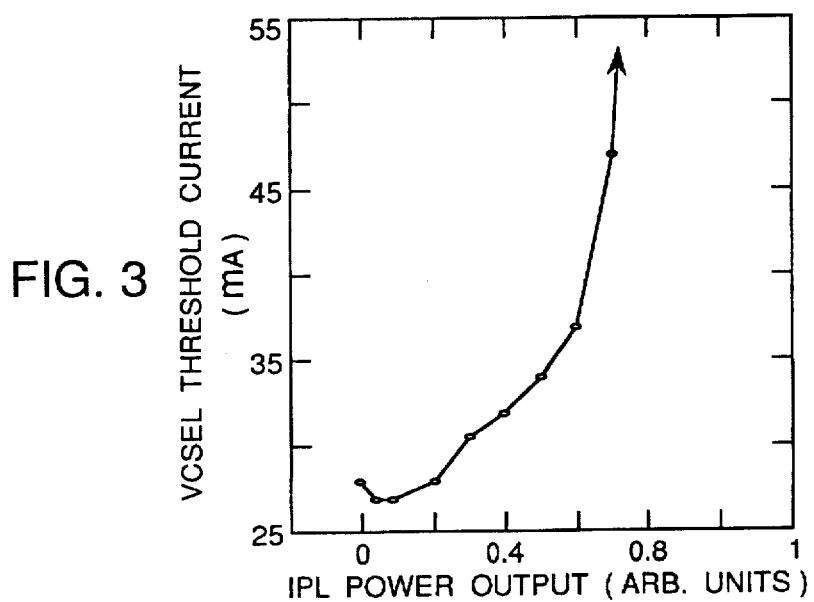
FIG. 3 is a chart of VCSEL lasing threshold current as a function of optical power from the IN-plane laser.
Figure 4:
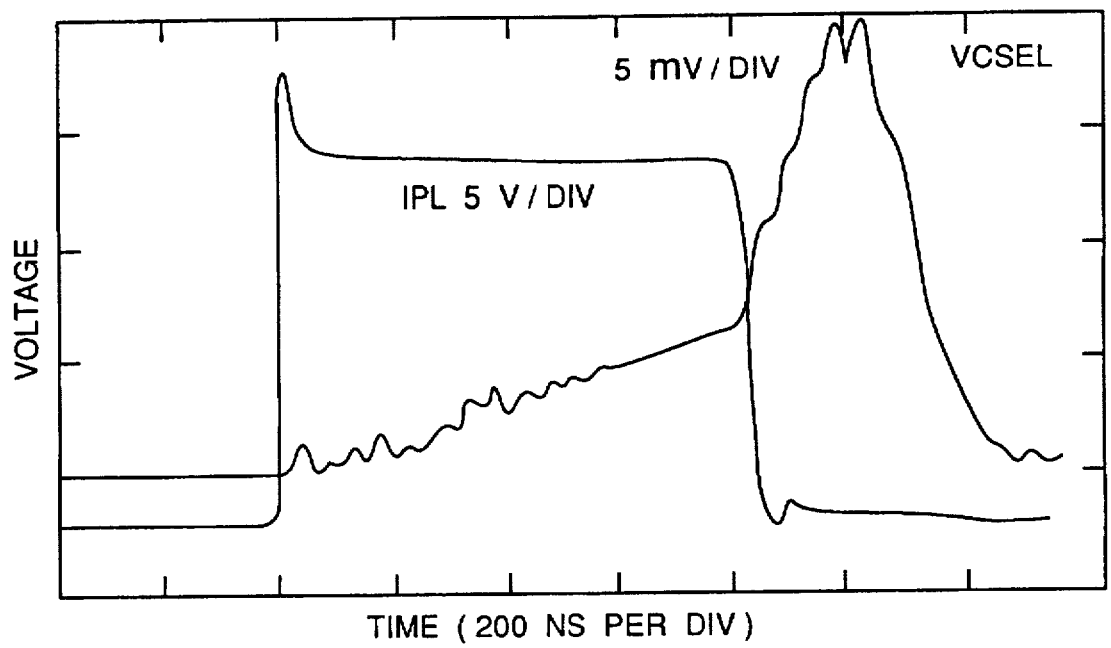
FIG. 4 is a chart of VCSEL voltage over time from an IPL applied pulse.

Further, for the case of the amplifier, both ends of the amplifier 112 can be antireflection (AR) coated for high gain because of the geometry of the VCSEL. The prototype (the laser version) is tested with pulsed bias current to reduce the heating effects. The pulse widths are typically on the order of 1 us. FIG. 3 shows that the VCSEL threshold current increases as the optical power from the in-plane lasers (IPL) increases. Initially, the VCSEL threshold current decreases as the optical power from the IPL increases. This behavior occurs since spontaneous emission and leakage currents from the IPL tend to pump the VCSEL cavity. FIG. 4 shows the results of a switching experiment. The square pulse represents the voltage (approx. 15 V) applied to the IPL and the other trace represents the optical power from the VCSEL. When the IPL is extinguished by removing its bias voltage, the VCSEL begins to lase as shown by an increase in its output power. However, the figure clearly shows the switching operation of the V-LOGIC device.

Figure 5:
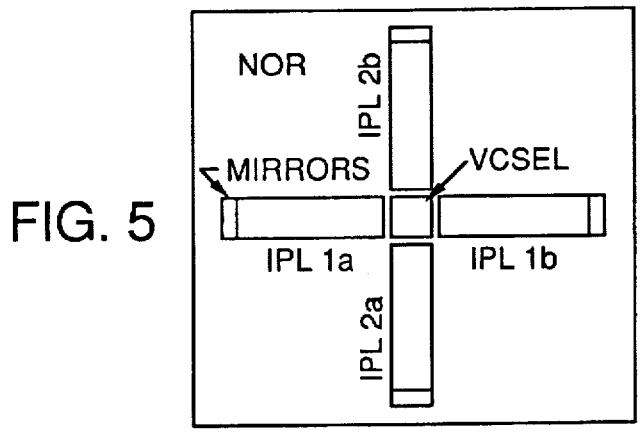
FIG. 5 is a NOR gate composed from two VCSEL lasers.
Figure 6:
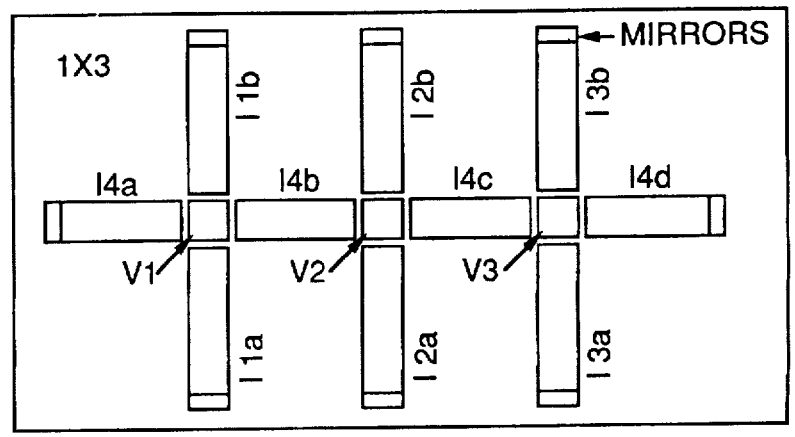
FIG. 6 is an optical signal routes using V-logic technology.

A top view of a NOR gate appears in FIG. 5. Two IPLs are shown with the VCSEL at the center. Each IPL is divided into two halves (a and b) but the halves are electrically connected in parallel. Thus stimulated emission from either IPL quenches the VCSEL. FIG. 6 shows a top view of a 1×3 router as another example. The three IPLs 11–13 enable the corresponding VCSELs V1–V3. IPL 14 carries the signal and modulates the enabled VCSELs.

FIG. 6 illustrates that the present invention can perform the NAND gate function. More specifically, consider FIG. 5 to be a NAND gate. This will happen when the central VCSEL is pumped by the two IPLs and has a lasing power threshold with a level that is selected to require both IPL signals before the VCSEL is activated. Similarly, FIG. 5 can be a NOR gate if the lasing power threshold of the central VCSEL has a level that is selected so that either IPL alone can activate and stimulate the emission of the central VCSEL.

The V-LOGIC devices have significant advantages over present optical smart pixels. The speed of the device is potentially faster than other laser-based hybrid devices. With proper construction, the V-LOGIC devices can be operated under steady-state biasing conditions without significant temperature or wavelength sensitivity. This includes the use of VCSELs with low resistance and the use of flip-chip bonded heat sinks. The V-LOGIC family consists of integrated, all-optical logic devices with low-divergence symmetrical beams that can perform logic functions and serve as optical interconnections between signal planes. The addition of a diffractive optical grating to the top mirror stacks can reduce divergence even more. The devices have good contrast ratio compared with reflective modulators. The technology is compatible with existing, monolithic Photonic Integrated Circuit (PIC) fabrication methods and it is very flexible. For example, one IPL may be used to control the output of multiple VCSELs, or multiple IPLs may be coupled to a single VCSEL to implement an all-optical NOR gate. Other IPLs or VCSELs can optically control the V-LOGIC devices; in this way, the V-LOGIC devices can be cascaded. In addition, the IPL offers a wide variety of established options to electrically control the in-plane laser output and, consequently, that of the VCSEL. For example, intra-cavity electro-optic modulator sections can be used to electrically control the in-plane laser output and, consequently, that of the VCSEL. Likewise, amplitude modulation of the IPL is translated to the VCSEL output, with inversion of the input signal. The V-LOGIC devices are significantly less expensive to package compared with other devices. They require neither expensive lensing systems nor complex alignment procedures. They can be easily attached to optical fibers if necessary. All of these features make the package mechanically robust and inexpensive.

There are several alternate modes for the V-LOGIC DEVICES. One improvement appears in FIG. 4. Here the VCSEL is moved further into the body of the IPL and away from the mirror. This prevents etching the sides of the VCSEL and thereby reduces the effects of the surface upon the threshold current and the external differential efficiency.

Add another atomic species to the quantum wells so that the substrate is transparent to the light emitted from the VCSEL. For example, indium can be added to the GaAs quantum well so that the VCSEL emits photons with energy smaller than the GaAs or AlGaAs band gaps. Wafers made in this manner are more easily stacked into a multiplanar architecture with signal propagating upward and downward. This would be useful for an optical backplane.

An absorber section can be added to the IPL so that the IPL can be switched by integrated electronics if necessary for a particular application. The absorber is located between the mirrors of the IPL but away from the VCSEL. However, another variation uses the VCSEL as a modulator or a light emitter or light detector. Absorber sections can be used to make a memory element that switches between lasing in the in-plane direction and lasing in the vertical direction.

Figure 1:
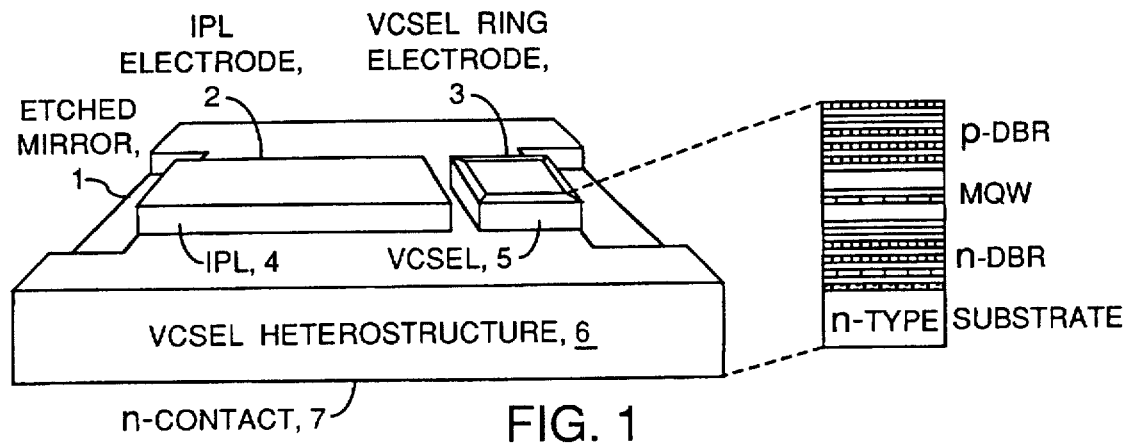
FIG. 1 is an elevated side view of the present invention.

The substrate can be changed from n-type with an electrode across the bottom side as in FIG. 1 to a semi-insulating substrate. The n+ layer is then electrically insulated from the exposed bottom side. This makes it possible to fabricate circuits such that V-LOGIC devices are totally electrically isolated from one another; this greatly increases the flexibility for circuit design.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. Apparatus to manipulate the optical properties of light comprising:
   means for generating a stimulated optical emission from a substantially planar substrate;
   said means for generating including at least one first source of stimulated emission that emits out of a plane of said substrate;
   said means for generating including further at least one second source of stimulated emission that emits parallel to said plane of said substrate; and
   an optical emission from said second source interacting with at least a portion of said first source.

2. Apparatus as in claim 1, wherein said apparatus performs at least one logic function.

3. Apparatus as in claim 2, wherein said at least one logic function is chosen from the group consisting of AND, NAND, INVERT, OR, NOR, and ADD.

4. Apparatus as in claim 1, wherein said apparatus performs at least one system function.

5. Apparatus as in claim 4, wherein said at least one system function is chosen from the group consisting of storage, signal amplification, regeneration, signal routing, wavelength conversion, signal modulation, asynchronous transmission mode switching, packet switching, and multiplexing.

6. Apparatus as in claim 1, wherein said second source is monolithically integrated with said first source.

7. Apparatus as in claim 1, wherein said second source is a Laser.

8. Apparatus as in claim 1, wherein said second source is an optical laser amplifier.

9. Apparatus as in claim 1, wherein said second source is an optical fiber coupled to said first source.

10. Apparatus as in clam 1, wherein said first source is a Vertical Cavity Surface Emitting Laser (VCSEL).

11. Apparatus as in claim 1, wherein said first source is an optical amplifier that operates on light signals having wave vectors that are not parallel to the plane of said substrate.

12. Apparatus as in claim 1, wherein said first source operates from energy supplied by a one of electrical and optical sources.

13. Apparatus as in claim 2, wherein said apparatus is disposed to be pumped electrically or optically so that said at least one logic function is provided on an inplane signal.

14. Apparatus as in claim 1, wherein said at least one second source occupies a portion of said at least one first source.

15. Apparatus as in claim 1, wherein said at least one first and said at least one second source do not overlap.

16. Apparatus as in claim 1, wherein said at least one first source partially overlaps said at least one second source.

17. Apparatus as in claim 1, wherein said at least one first source has a separately-biased portion that forms a saturable absorber to provide bistability in output characteristics.

18. Apparatus as in claim 1, wherein said at least one first source has a separately-biased portion that forms a modulator.

19. A method of processing an optical signal comprising the steps of:
   fabricating in a substantially planar substrate a first source of stimulated emission that emits in a direction non-parallel to a plane of said substrate;
   coupling to said first source a second source of stimulated emission that emits parallel to said plane;
   applying a bias to at least one of said first and second sources, said bias being a one of optical and electrical; and
   extracting from said first source an optical signal propagating perpendicular to said plane.

20. Apparatus to manipulate information encoded into an emission of light comprising:
   means for generating a stimulated optical emission from a substantially planar substrate;
   said means for generating including at least one first source of stimulated emission that emits out of a plane of said substrate;
   said means for generating including further at least one second source of stimulated emission that emits parallel to said plane of said substrate; and
   an optical emission from said second source interacting with at least a portion of said first source.

* * * * *